United States Patent
Shuja

(10) Patent No.: US 8,188,595 B2
(45) Date of Patent: May 29, 2012

(54) TWO-PHASE COOLING FOR LIGHT-EMITTING DEVICES

(75) Inventor: Ahmed Shuja, Richmond, CA (US)

(73) Assignee: Progressive Cooling Solutions, Inc., Hayward, CA (US)

( * ) Notice: Subject to any disclaimer, the term of this patent is extended or adjusted under 35 U.S.C. 154(b) by 0 days.

(21) Appl. No.: 12/258,289

(22) Filed: Oct. 24, 2008

(65) Prior Publication Data

US 2010/0038660 A1    Feb. 18, 2010

Related U.S. Application Data

(60) Provisional application No. 61/188,908, filed on Aug. 13, 2008.

(51) Int. Cl.
H01L 23/34 (2006.01)
(52) U.S. Cl. ...................................................... 257/714
(58) Field of Classification Search .................. 257/714, 257/715, E23.087, E23.088, E23.089
See application file for complete search history.

(56) References Cited

U.S. PATENT DOCUMENTS

| | | | |
|---|---|---|---|
| 3,843,463 A | 10/1974 | Brown | |
| 4,170,262 A | 10/1979 | Marcus et al. | |
| 4,416,325 A * | 11/1983 | Barratt et al. | 165/47 |
| 4,685,512 A | 8/1987 | Edelstein et al. | |
| 4,697,205 A | 9/1987 | Eastman | |
| 4,825,661 A | 5/1989 | Holtzapple et al. | |
| 4,835,976 A | 6/1989 | Torrence | |
| 4,874,484 A | 10/1989 | Foell et al. | |
| 5,431,766 A | 7/1995 | Propst et al. | |
| 5,944,092 A | 8/1999 | Van Oost | |
| 6,227,288 B1 | 5/2001 | Gluck et al. | |
| 6,330,907 B1 | 12/2001 | Ogushi et al. | |
| 6,381,135 B1 | 4/2002 | Prasher et al. | |
| 6,533,029 B1 | 3/2003 | Phillips | |
| 6,552,901 B2 | 4/2003 | Hildebrandt | |
| 6,601,643 B2 * | 8/2003 | Cho et al. | 165/104.26 |
| 6,615,912 B2 | 9/2003 | Garner | |
| 6,654,860 B1 | 11/2003 | Strongin et al. | |
| 6,657,121 B2 | 12/2003 | Garner | |
| 6,745,825 B1 | 6/2004 | Nakamura et al. | |

(Continued)

FOREIGN PATENT DOCUMENTS

DE    10011253    9/2001

(Continued)

OTHER PUBLICATIONS

L.T., Canham, "Silicon Quantum Wire Array Fabrication by Electrochemical and Chemical Dissolution of Wafer", *Applied Physics Letters*, vol. 57, 1990, pp. 1046-1048.

(Continued)

*Primary Examiner* — Bradley K Smith
(74) *Attorney, Agent, or Firm* — Perkins Coie LLP

(57) ABSTRACT

System, method, and apparatus for two phase cooling in light-emitting devices are disclosed. In one aspect of the present disclosure, an apparatus includes a light-emitting device and a two-phase cooling apparatus coupled to the light-emitting device. The coupling of the two-phase cooling apparatus and the light-emitting device is operatively configured such that thermal coupling between the light-emitting device and the two-phase cooling apparatus enables, when, in operation, heat generated from the light-emitting device to be absorbed by a substance of a first phase in the two-phase cooling apparatus to convert the substance to a second phase.

32 Claims, 10 Drawing Sheets

U.S. PATENT DOCUMENTS

| | | | |
|---|---|---|---|
| 6,799,628 B1 | 10/2004 | Masseth et al. | |
| 6,804,117 B2 | 10/2004 | Phillips et al. | |
| 6,810,946 B2 | 11/2004 | Hoang | |
| 6,840,304 B1 | 1/2005 | Kobayashi et al. | |
| 6,863,117 B2 | 3/2005 | Valenzuela | |
| 6,889,744 B2 | 5/2005 | Keetman et al. | |
| 6,889,755 B2 | 5/2005 | Zuo et al. | |
| 6,916,412 B2 | 7/2005 | Woodruff et al. | |
| 6,948,556 B1 | 9/2005 | Anderson et al. | |
| 6,972,365 B2 | 12/2005 | Garner | |
| 6,972,955 B2 | 12/2005 | Pleskach et al. | |
| 6,981,543 B2 | 1/2006 | Chesser et al. | |
| 7,002,247 B2 | 2/2006 | Mok et al. | |
| 7,013,956 B2 | 3/2006 | Thayer et al. | |
| 7,017,654 B2 | 3/2006 | Kenny et al. | |
| 7,120,022 B2 | 10/2006 | Belady et al. | |
| 7,180,179 B2 | 2/2007 | Mok et al. | |
| 7,205,665 B1 | 4/2007 | Chung et al. | |
| 7,208,069 B2 | 4/2007 | Christophersen et al. | |
| 7,210,832 B2 | 5/2007 | Huang | |
| 7,251,889 B2 | 8/2007 | Kroliczek et al. | |
| 7,318,322 B2 | 1/2008 | Ota et al. | |
| 7,380,584 B2 | 6/2008 | Ippoushi et al. | |
| 7,407,083 B2 | 8/2008 | Rogers | |
| 7,431,071 B2 | 10/2008 | Wenger | |
| 7,461,688 B2 | 12/2008 | Huang et al. | |
| 7,692,926 B2 | 4/2010 | Henderson et al. | |
| 7,705,342 B2 | 4/2010 | Henderson et al. | |
| 7,723,760 B2 | 5/2010 | Henderson et al. | |
| 7,723,845 B2 | 5/2010 | Henderson et al. | |
| 2002/0135980 A1 | 9/2002 | Vafai | |
| 2003/0042009 A1 | 3/2003 | Phillips | |
| 2003/0051859 A1 | 3/2003 | Chesser et al. | |
| 2003/0066625 A1 | 4/2003 | Kirshberg et al. | |
| 2003/0075306 A1 | 4/2003 | Zuo et al. | |
| 2003/0192669 A1 | 10/2003 | Wu | |
| 2003/0211791 A1 | 11/2003 | Wu | |
| 2004/0050533 A1* | 3/2004 | Chesser et al. | 165/46 |
| 2004/0104012 A1* | 6/2004 | Zhou et al. | 165/104.26 |
| 2004/0206480 A1 | 10/2004 | Maydanik et al. | |
| 2005/0230085 A1 | 10/2005 | Valenzuela | |
| 2005/0239292 A1 | 10/2005 | Christophersen et al. | |
| 2005/0274488 A1 | 12/2005 | Wu | |
| 2005/0280128 A1 | 12/2005 | Mok et al. | |
| 2006/0071222 A1 | 4/2006 | Yatsuda et al. | |
| 2006/0076046 A1 | 4/2006 | Ghoshal et al. | |
| 2006/0144564 A1 | 7/2006 | Thayer et al. | |
| 2006/0276047 A1 | 12/2006 | Ouyang et al. | |
| 2007/0095507 A1 | 5/2007 | Henderson et al. | |
| 2008/0048306 A1 | 2/2008 | Stewart et al. | |
| 2008/0110598 A1 | 5/2008 | Henderson et al. | |
| 2008/0115912 A1 | 5/2008 | Henderson et al. | |
| 2008/0115913 A1 | 5/2008 | Henderson et al. | |
| 2008/0128898 A1 | 6/2008 | Henderson et al. | |
| 2008/0290363 A1 | 11/2008 | Lin et al. | |
| 2009/0315062 A1 | 12/2009 | Su et al. | |
| 2010/0038660 A1 | 2/2010 | Shuja et al. | |
| 2010/0132404 A1 | 6/2010 | Shuja et al. | |
| 2011/0043092 A1 | 2/2011 | Shuja et al. | |

FOREIGN PATENT DOCUMENTS

| | | |
|---|---|---|
| DE | 102004011394 | 9/2005 |
| DE | 10362083 | 5/2007 |
| EP | 0296348 | 12/1988 |
| JP | 200436308 | 12/2004 |
| KR | 2001009131 A * | 2/2001 |
| KR | 2004032473 A | 4/2004 |
| WO | WO-9822767 | 5/1998 |
| WO | WO-02086994 | 10/2002 |
| WO | WO-2004097907 A2 | 11/2004 |
| WO | WO-2004097907 A3 | 11/2004 |
| WO | WO-2007035295 | 3/2007 |

OTHER PUBLICATIONS

J. Carstensen, M. Christophersen, and H. Föll, "Crystal Orientation Dependence of Macropore Formation in n-type Silicon Using Organic Electrolytes," Physics Status Solid A, vol. 182, pp. 601-606, 2000.

S. Ronnebeck, J. Carstensen, S. Ottow, and H. Föll, "Crystal Orientation Dependence of Macropore rowth in n-type Silicon," Electrochemical and Solid State Letters, vol. 2, vol. 69, pp. 126-128, 1999.

V. Lehmann, "The physics of macropore formation in low doped n-type silicon", Journal of Electrochemical Society, vol. 140, No. 10, Oct. 1993, pp. 2836-2843.

V. Lehmann, U. Gruening, "The limits of macropore array fabrication", Thin Solid Films, vol. 297, No. 1-2 Apr. 1, 1997, p. 13-17.

Carstensen J., Christophersen M., Hasse G., Foll H., "Parameter Dependence of Pore Formation in Silicon within a Model of Local Current Bursts", J. Electrochem Soc, vol. 182, 63-69, (2000).

X. G. Zhang, "Morphology and Formation Mechanisms of Porous Silicon" Journal of Electrochemical Society, vol. 151, pp. C69-C80, 2004.

H. Föll, J. Carstensen, M. Christophersen, G. Hasse, "A New View of Silicon Electrochemistry" Physics Status Solid A, vol. 182, pp. 7-16, 2000.

Dhillion, et al., "A High Heat Flux Localized Cooling Technology for Electronic Substrates", Proceedings of 2008 International Mechanical Engineering Congress and Exposition, Nov. 2-6, 2008, Boston, pp. 1-10.

Alexseev, "Micro Loop Heat Pipe Evaporator Coherent Pore Structures", Masters Thesis, Texas A&M University, Aug. 2003, pp. 1-116.

Ghajar, et al., "Numerical Modeling of Evaporator Surface Temperature of a Micro Loop Heat Pipe at Steady-State Condition", Journal of Micromechanics and Microengineering, vol. 15, pp. 1963-1971 (2005).

Oinuma, "Study of Evaporation Model in Micron Pore", A Dissertation for Doctorate of Philosophy, Texas A&M University, Aug. 2004, pp. 1-193.

IBM Touts New Liquid-Cooling Technique, IBM to Use Liquid to Cool 3D Chips, http://www.xbitlabs.com/news/coolers/display/20080606111039_IBM_Touts_New_Liquid_Cooling_Technique.html, pp. 1-4, Jun. 6, 2008.

Product-Chip Level Multilayer Channels for Spray Cooling Demonstrated 370W/cm2, http://www.zurich.ibm.com/news/06/cooling.html, Oct. 26, 2006, pp. 1-3.

Marques, "Manufacturing and Analysis of a LIGA Heat Exchanger for the Surface of a Cylinder: A Cooling Simulation of the Leading Edge Region of a Turbine Blade" 2002 Mechanical Engineering Graduate Student Conference, Louisiana State University, Apr. 13, 2002, pp. 29-30.

Ortega, "Thermal Engineering Research Motivated by Cooling of Electronic Systems: A National Science Foundation Perspective" Cisco Research Symposium Aug. 29-30, 2006, pp. 1-17.

Ghajar, et al., "A Hybrid CFD-Mathematical Model for Simulation of a MEMS Loop Heat Pipe for Electronics Cooling Applications", Journal of Micromechanics and Microengineering, Published 2005, pp. 313-321.

Shuja, et al., "Development of a MEMS Micro Loop Heat Pipe for Electronics Cooling", Department of Electrical and Computer Engineering and Computer Science Department of Mechanical, Industrial, and Nuclear Engineering University of Cincinnati, pp. 1-8.

Dhillon, et al., "MEMS Power: mLHP Chip Cooling System-Calumniated Wick and Device Design", Berkeley Sensor & Actuator Center Semi-Annual Research Report, Prepublication Data Mar. 2008, pp. 360-367.

Cullis, et al., "The Structural and Luminescence Properties of Porous Silicon", Applied Physics Reviews, published Apr. 16, 1997, pp. 909-965.

Zimbeck, et al, "Loop Heat Pipe Technology for Cooling Computer Servers", May 2008, pp. 19-25.

http://www.ammt.com/, "Hydrofluoric Acid Vapor Etcher", p. 1, Feb. 24, 2009.

Suh, "Operating Ranges of the Planer Loop Heat Pipe", Proceedings of ASME Summer Heat Transfer Conference, HT2005, Jul. 17-20, 2005, pp. 1-6, San Francisco, California.

Cytrynowicz, et al., "Test Cell for a Novel Planar MEMS Loop Heat Pipe Based on Coherent Porous Silicon", Space Technology & Applications International Forum, pp. 1-12, Feb. 2-6, 2003, Albuquerque, New Mexico.

Cytrynowicz, et al.,"The MEMS Loop Heat Pipe Based on Coherent Porous Silicon-The Modified System Test Structure", Space Technology and Applications International Forum, pp. 1-9, Feb. 8-11, 2004, Albuquerque, New Mexico.
Hamdan,"Loop Heat Pipe (LHP) Development by Utilizing Coherent Porous Silicone (CPS) Wicks", ITHERM International Conference on Thermal Phenomena in Electronic Systems, pp. 457-465, May 29-Jun. 1, 2002, San Diego, California.
Suh,"Nucleate Boiling Inside the Evaporator of the Planar Loop Heat Pipe", International Mechanical Engineering Congress and Exposition, IMECE, Nov. 13-19, 2004, pp. 1-9, Anaheim, California.
Holke, et al., Coherent Macro, "Porous Silicon as a Wick Structure in an Integrated Microfluidic Two-Phase Cooling System", Proceedings of the 1998 SPIE Conference on Microference on Microfludic Device and Systems, Santa Clara, Sep. 21-22, 1998, pp. 154-162.
International Search Report PCT/US2006/035193 dated Feb. 5, 2007.
Mantravadi, "MEMS-Based Development of a Silicon CPS Wick for Loop Heat Pipe Applications", Masters Thesis, University of Cincinnati, Ohio, 2000, pp. 1-124.
Cytrynowicz, et al., "MEMS Loop Heat Pipe Based on Coherent Porous Silicon Technology, Space Technology and Applications International Form-STAIF", pp. 220-232, Nov. 17-22, 2002, New Orleans.
V. Lehmann, "Electrochemistry of Silicon Instrumentation, Science, Materials and Applications," Wiley-VCH Verlag GmbH, 2002, pp. 1-296.
A. Shuja, "Development of a Micro Loop Heat Pipe, a Novel Mems System Based on the CPST Technology", M.S. Thesis, University of Cincinnati, 2003, pp. 1-264.
Eco Depot; "ICEPIPE Technologies EcoDepot's IcePipe series—High Bay LED Products"; http;//www.ecodepotled.com/technologies_icepipe_index.php; Mar. 25, 2011, pp. 1-2.
NeoPac Opto-Open the Door to LED Illumination Home; http://www.neopac-opto.com; Mar. 25, 2011; p. 1 of 1.
Thermoking Technology International Corporation; "Thermoking Technology International Corporation" Mar. 25, 2011; p. 1 of 1.
Zaonzi Corporation; "The First Technology" http://www.zaonzi.com/company/company04.php; Mar. 25, 2011; p. 1 of 1.
EcoCentury Technlogies Inc.; LED Lighting Systems; "EcoCentury Technologies"; http://ecocentury.ca/products-and-services/led-lighting-systems; Mar. 25, 2011; pp. 1-3.
Bin-Juine Huang, et al.; "Development of High-Power LED Lighting Luminaires Using Loop Heat Pipe"; J. Light & Vis. Env. vol. 32, No. 2; 2008; pp. 98-105.
U.S. Appl. No. 11/530,107, filed Sep. 8, 2006.
U.S. Appl. No. 11/932,911, filed Oct. 31, 2007.
U.S. Appl. No. 11/932,951, filed Oct. 31, 2007.
U.S. Appl. No. 11/932,969, filed Oct. 31, 2007.
U.S. Appl. No. 11/933,000, filed Oct. 31, 2007.
U.S. Appl. No. 61/188,956, filed Aug. 13, 2008.
U.S. Appl. No. 61/189,169, filed Aug. 15, 2008.
U.S. Appl. No. 61/190,869, filed Sep. 2, 2008.
U.S. Appl. No. 61/188,908, filed Aug. 13, 2008.
U.S. Appl. No. 12/327,728, filed Dec. 3, 2008.
U.S. Appl. No. 61/173,933, filed Apr. 29, 2009.
U.S. Appl. No. 61/235,661, filed Aug. 20, 2009.
U.S. Appl. No. 12/860,707, filed Aug. 20, 2010.
Restriction Requirement mailed Oct. 5, 2009 for Issued Patent No. 7,705,342, U.S. Appl. No. 11/530,107, filed Sep. 8, 2006.
Notice of Allowance mailed Dec. 17, 2009 for Issued Patent No. 7,705,342, U.S. Appl. No. 11/530,107, filed Sep. 8, 2006.
Notice of Allowance mailed Jan. 15, 2010 for Issued Patent No. 7,723,760, U.S. Appl. No. 11/932,951, filed Oct. 31, 2007.
Notice of Allowance mailed Jan. 12, 2010 for Issued Patent No. 7,723,845, U.S. Appl. No. 11/932,911, filed Oct. 31, 2007.
Restriction Requirement mailed Mar. 19, 2009 for Issued Patent No. 7,692,926, U.S. Appl. No. 11/932,969, filed Oct. 31, 2007.
Non-Final Office Action mailed Jun. 22, 2009 for Issued Patent No. 7,692,926, U.S. Appl. No. 11/932,969, filed Oct. 31, 2007.
Notice of Allowance mailed Nov. 17, 2009 for Issued Patent No. 7,692,926, U.S. Appl. No. 11/932,969, filed Oct. 31, 2007.
Restriction Requirement mailed Jan. 11, 2010 for U.S. Appl. No. 11/933,000, filed Oct. 31, 2007.
Non-Final Office Action mailed Jun. 14, 2010 for U.S. Appl. No. 11/933,000, filed Oct. 31, 2007.
Written Opinion PCT/US2006/035193 dated Feb. 5, 2007, pp. 1-5.
Non-final Office Action mailed Sep. 2, 2011 for U.S. Appl. No. 12/327,728, filed Dec. 3, 2008.
Non-final Office Action mailed Sep. 26, 2011 for U.S. Appl. No. 12/860,707, filed Aug. 20, 2010.
U.S. Appl. No. 61/505,419, filed Jul. 7, 2011.
IBM Researchers Develop Next-Generation Chip-Cooling Technologies; ""Cool" Micro-technologies Make Hot Chips Chill", London, England, Oct. 26, 2006, BroadGroup Power and Cooling Summit, IBM Zurich Research Laboratory, pp. 1-3.

* cited by examiner

TWO-PHASE COOLING FOR LIGHT-EMITTING DEVICES

CLAIM OF PRIORITY

This application claims priority to U.S. Provisional Patent Application No. 61/188,908 entitled "Micro-loop Heat Pipes for LED Cooling", which was filed on Aug. 13, 2008, the contents of which are expressly incorporated by reference herein.

TECHNICAL FIELD

The techniques are generally related to the field of thermal management and packaging of light-emitting devices, in particular, to two-phase cooling of light-emitting diodes.

BACKGROUND

When using white LEDs as a light source, the ($\eta_{LED}$) or wall efficiency is typically 20% to 30% of input power. This is the effective percentage of electricity that is converted to visible light, while the remaining 70% to 80% of input power is converted to heat that must be conducted from the LED die to the underlying heat sink, housing and finally to the surrounding air to maintain an acceptable LED junction temperature. In the United States, the goals of solid state lighting have been identified by the Department of Energy (DOE) and the Optoelectronics Industry Development Association (OIDA). The DOE would like to reproduce the spectrum of sunlight at 50% system efficiency, while the OIDA goal is to achieve an efficiency of 200 lm/W with good color rendering by 2020.

There is a feverish race to achieve LED and/or HBLED modules that can cannibalize the market for incandescent bulbs in the area of illumination. In order to achieve such a goal in moving LED's from indication applications to general illumination thermal management has become a major area in need of innovation. The thermal resistance of LED packages together with the maximum operating temperature determines the maximum power that can be dissipated in the package. At the outset of LED packaging in the 1960's the thermal resistance of a 5 mm package (still used for low power LEDs) typically would be 250 K/W.

Some LED packages utilize surface mount technology (SMT) as illustrated in the example of FIG. 1. The key feature of SMT technology, is the onboard heat sink typically made of copper or aluminum. SMT packaging approaches can generally typically achieve 6-12 K/W thermal resistance. Some SMT packaging having a thermal resistance of 2.5 K/W and 9 W of power handling. This level of thermal resistance is typically achieved when the junction temperature reaches approximately 432K (159° C.).

Note that the LED junction temperature is directly related to the emission spectrum and the spectrum shift caused by slight variations in temperature is generally sensed by the human eye. Thus, considerable effort should be made in maintaining the junction temperature substantially constant and low to ensure robust and reliable operations of LEDs for various applications. In addition, packaging multiple LED dies in a single SMT package is a difficult task due to thermal crosstalk. Thus an incandescent bulb replacement for general illumination is currently out of reach of the majority of LED vendors.

DETAILED DESCRIPTION

Figure 1:
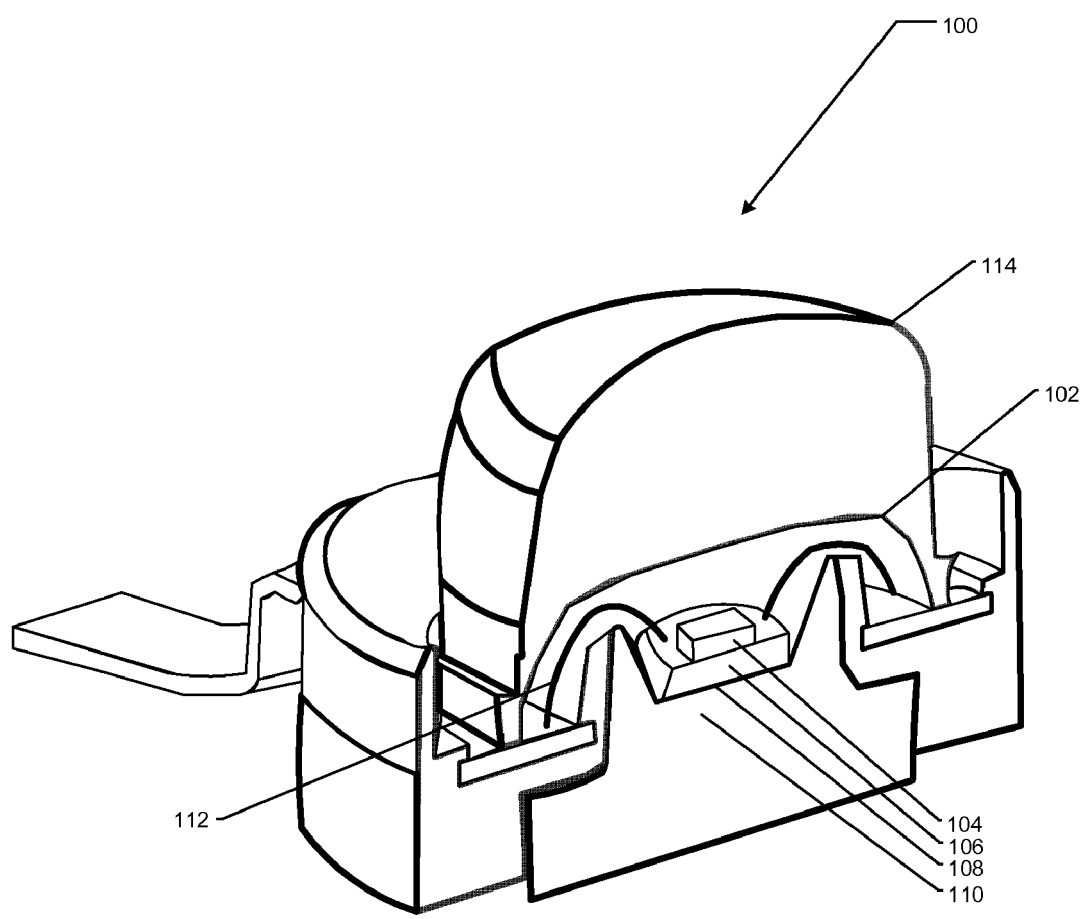
FIG. 1 illustrates a cross sectional view of an LED package of the surface mount type.

The following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be, but not necessarily are, references to the same embodiment; and, such references mean at least one of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way.

Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to further limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, all technical and scientific terms used herein have the same meaning as commonly understood by one of ordinary skill in the art to which this disclosure pertains. In the case of conflict, the present document, including definitions will control.

Embodiments of the present disclosure include systems, apparatuses, and methods for thermal management and cooling in light emitting devices. One embodiment includes integration of a micro-loop heat pipe with discrete or indiscrete packaging for light emitting devices (e.g., LED/HBLED). The coupling of the two-phase cooling apparatus and the light-emitting device can be operatively configured such that thermal coupling between the light-emitting device and the two-phase cooling apparatus enables heat generated from the light-emitting device to be absorbed by a substance of a first phase in the two-phase cooling apparatus, the absorbed heat converting the substance to a second phase. The light emitting device can be formed on a wafer or a die. The substance may comprise substantially of water. In one embodiment, the first phase is liquid and the second phase is vapor.

The heat absorbed from the light-emitting device is typically at least a latent heat of the substance.

In one embodiment, the two-phase cooling apparatus further comprises, a vapor port that is substantially unobstructed in operation to allow exit of generated vapor and a chamber thermally coupled to the light-emitting device. When, in operation, the heat generated from the light-emitting device can be absorbed by the liquid stored in the chamber.

In one embodiment, the two phase cooling apparatus further comprises, a condensor coupled to the vapor port and/or a liquid port coupled to the condensor and the chamber suitable for storage of liquid. In addition, a heat sink may be coupled to the condenser and an air flow generator can be coupled to the heat sink.

One embodiment of an apparatus includes, a light-emitting device and a two-phase cooling apparatus coupled to the light-emitting device. One embodiment of the two-phase cooling apparatus comprises a micro-loop heat pipe. The micro-loop heat pipe can include a top cap portion and/or a layer having porous semiconductor structures thermally coupled to the top cap portion. The top cap portion may be coupled to the light-emitting device.

The porous semiconductor structures generally form through-holes across the layer. The through-holes have first and second ends where the first ends of the through-holes can be proximal to the top cap portion and the second ends of the through-holes can be proximal to the chamber. In one embodiment, the top cap portion is coupled to the layer having porous semiconductor structures such that the first ends of the through-holes are substantially unobstructed to liquid or vapor flow.

The micro-loop heat pipe can further include a chamber suitable for storage of liquid coupled to the layer having porous semiconductor structures. In one embodiment, the chamber is coupled to the layer having porous semiconductor structures such that, when in operation, the liquid in the chamber travels through the through-holes. The heat generated from the light-emitting device causes the liquid stored in the chamber to travel through the through-holes and convert into vapor. In one embodiment, the top cap portion has formed within or is coupled to a vapor port.

One embodiment of the apparatus further includes an electrostatic discharge circuitry electrically coupled to the light emitting device. The electrostatic discharge circuitry can include a first diode connected to the light-emitting diode in parallel. The electrostatic discharge circuitry can further include, a second diode electrically connected to the first diode. In one embodiment, the first diode is a zener diode having a lower breakdown voltage than the light-emitting diode.

FIG. 1 illustrates a cross sectional view of an LED package 100 of the surface mount type.

One common package type for a LED packaging or HBLED packaging is that of the surface mount type. An example of surface mount packaging is shown in FIG. 1. The LED package 100 has a light-emitting diode (LED) or LED die 104. The LED device or LED die 104 can be bonded to a carrier wafer 106 (e.g., silicon, germanium, or other semiconductor-based carrier wafer). The carrier wafer typically contains patterned diodes which can provide protection from Electrostatic Discharge (ESD). The carrier wafer 106 can be further mounted to a heat sink 110 via a bonding layer 108 (e.g., solder bond). In general, the heat sink 110 can be any type of heat spreader or heat slug that is made from material with high thermal conductivity including but not limited to aluminum and copper.

The bias that drives the LED diode 104 can be applied by wires 112 (e.g., gold or copper wires). The wires 112 can be further connected to the external leads of the copper electrodes of the SMT package. The LED 104, in some instances, emits UV or ultra-violet light that can be converted to white light, for example, using a phosphor coating of the LED 104. The phosphor coating can be embedded in silicone carrier 102 that surrounds the LED 104. The phosphor coating may further be sealed in by a polymeric lens 114. The heat that is generated by the LED 104 typically conducts through the wafer 106 and then into the heat sink 110.

Figure 2:
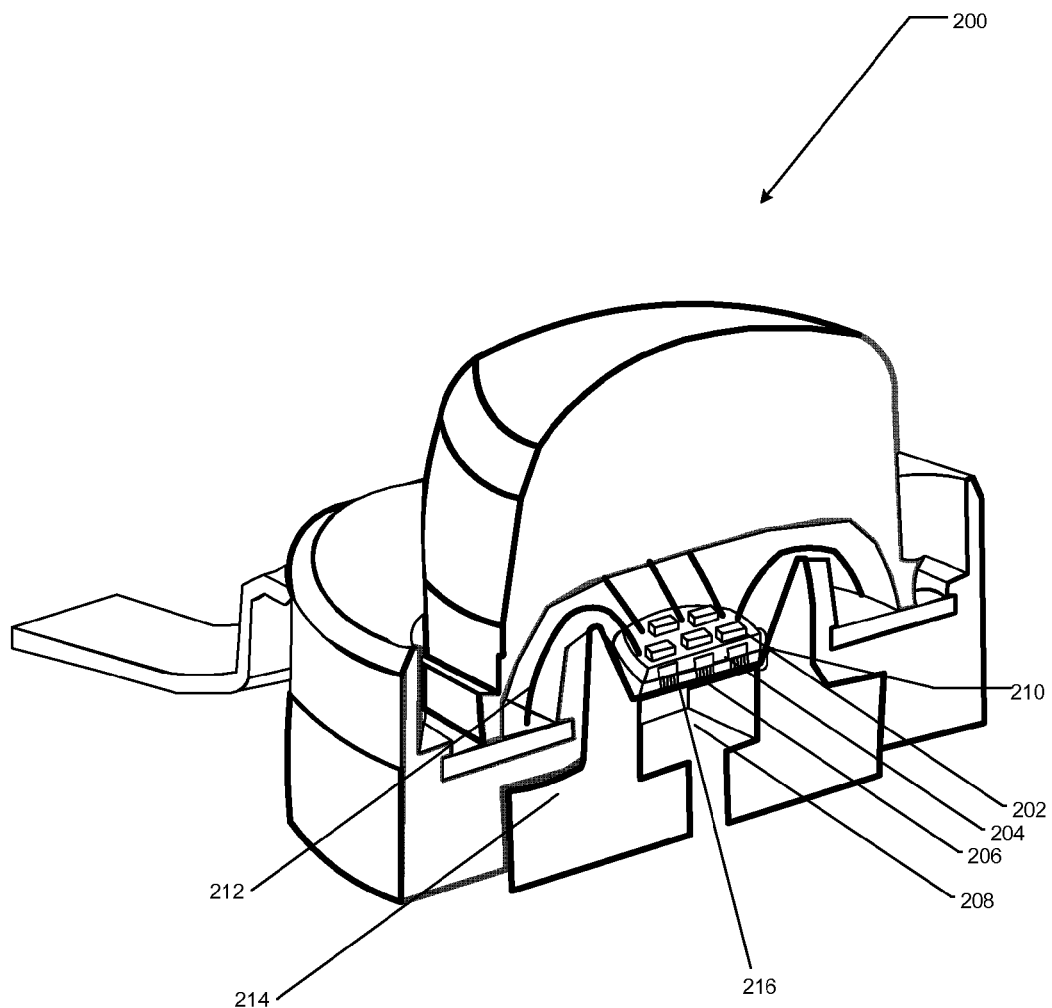
FIG. 2 illustrates a cross sectional view of a surface mount LED package 200 integrated with a two-phase cooling apparatus in a surface mount package, according to one embodiment.

FIG. 2 illustrates a cross sectional view of a surface mount LED package 200 integrated with a two-phase cooling apparatus in a surface mount package, according to one embodiment.

In one embodiment, one or more LED devices or dies 202 can be integrated with a two-phase cooling apparatus to facilitate cooling of the one or more LED devices or dies 202. The two-phase cooling apparatus can be a micro-loop heat pipe that is packaged with the LEDs 202 in the LED package 200.

For example, the integration can be implemented by coupling the LEDs 202 with the evaporator 210 of the micro-loop heat pipe. The evaporator 210 can further be integrated with the SMT LED package 200 thus allowing the liquid flow below the LED devices or dies 202 to absorb heat generated from operation and to prevent the junction temperature from substantially rising. Improved thermal management through integration of a two-phase cooling apparatus can substantially prevent increase in junction temperature and maintain the temperature within certain ranges can facilitate increased LED packing density to obtain the desired illumination according to the lighting application.

During operation, the heat generated by the LEDs 202 at least partially conduct through a layer 204, also referred to as a top cap. The top cap 204, in one embodiment, channels vapor to a vapor exit path (not shown). The vapor is generated from liquid stored in the chamber 208. The top cap 204 typically comprises substantially of any material that has a low or high thermal conductivity depending on the embodied design.

In one embodiment, the material of the top cap 204 has a coefficient of thermal expansion (CTE) that is suitable for reduced cyclic thermal stress. In general, the material of the top cap 204 is selected taking into consideration thermal expansion (e.g., as measured by coefficient of thermal expansion, linear thermal expansion, area thermal expansion and/or volumetric thermal expansion) and/or the thermal conductivity. Materials that are generally thermal conductive or thermally conductive during specified/predetermined operating conditions having a suitable degree of thermal expansion can, in one embodiment, be ideal for top cap 204 material. For example, the top cap 204 can comprise, one or more of, silicon, germanium, diamond, SiC, AlN, $Al_2O_3$, and/or CMOS-grade silicon. In addition, the top cap 204 can also be formed out of Kovar, Kovar with silver, Cu, CuW (e.g., copper tungsten alloy), Al and/or anodized Al.

In one embodiment, the underlying structure 214 is retrofit to form the chamber 208 that when filled with liquid acts as a compensation chamber. The structure 214 in the example of FIG. 2 typically functions as a heat sink or other type heat spreaders comprising one or more materials with high thermal conductivity, including but not limited to aluminum or copper, for example. Additionally, non-metallic material can also be used in the structure 214 since thermal conduction is not the primary mechanism for heat dissipation. For example, the underlying structure 214 can also be formed from glass, silicon, AlN, $Al_2O_3$ and/or ceramics. The manifold of liquid and vapor allows for heat to be carried away from the LEDs 202 and out of the SMT LED package 200 to an externally coupled surface area heat sink (not shown).

Figure 3A:
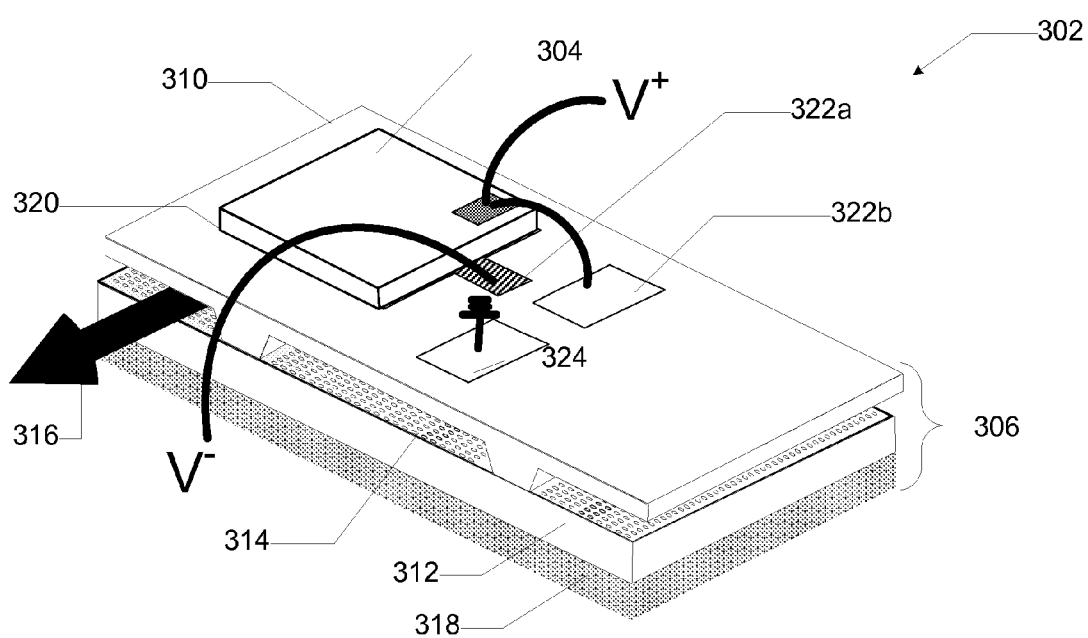
FIG. 3A illustrates an LED die packaged on the evaporator of the micro-loop heat pipe, according to one embodiment.

FIG. 3A illustrates an LED die 304 packaged on the evaporator 306 of the micro-loop heat pipe, according to one embodiment.

Heat generated from LED die 304 can flow through electrical and thermal joint 320 and then conduct to the top cap 310 of the micro-loop heat pipe 306. The heat is then thermally conducted through the top cap 310 substrate to a layer 312 with porous structures 314 coupled to the top cap 310.

In one embodiment, the porous structures 314 are micron sized capillaries coated by an oxide. For example, the coating may be substantially silicon dioxide when the layer 312 is comprised of silicon. The top cap 310 can transfer heat to liquid menisci causing the liquid menisci to evaporation in the porous structure 314 of the layer 312. As the liquid heats up and evaporates into vapor 316, the vapor 316 is routed along the cavities between the top cap 310 and the layer 312.

Note the porous structures 314 generally form through-holes in the layer 312. Thus, the heat can cause the liquid to travel through the porous structures 312 and vaporize in conjunction with removing heat from the LEDs 304. The heat removal can cause the LEDs to cool or to maintain temperature within a certain range. In addition, the porous structure 314 hydraulically connects the underlying liquid supply 318. The porous structures 312 can generally be formed from semiconductor materials that have crystal structures of diamond or zinc blend. In one embodiment, the porous structure 312 comprises coherent silicon pores that are substantially uniform in spatial distribution and have a high length to diameter aspect ratio (e.g., approximately or greater than 60 to 205).

The LED die 302 can be coupled to the top cap 304 such that electrical and thermal coupling occurs at joint 320. In one embodiment, the LED die 304 and evaporator 306 is protected from electrostatic discharge (ESD). Therefore, the thermal management and electrostatic discharge protection can be achieved to allow for multiple LED dies to be placed together to obtain the desired luminance. In one embodiment, ESD protection is achieved via a diode that is coupled to the LED die 302. For example, areas 322a and 322b can be lithographically patterned on the top cap 310 and subsequently doped n-type. An additional area 324 is doped p-type. The doped regions 322a/b and 324 form an N—P—N diode that can be biased in parallel with LED diode 304.

Figure 3B:
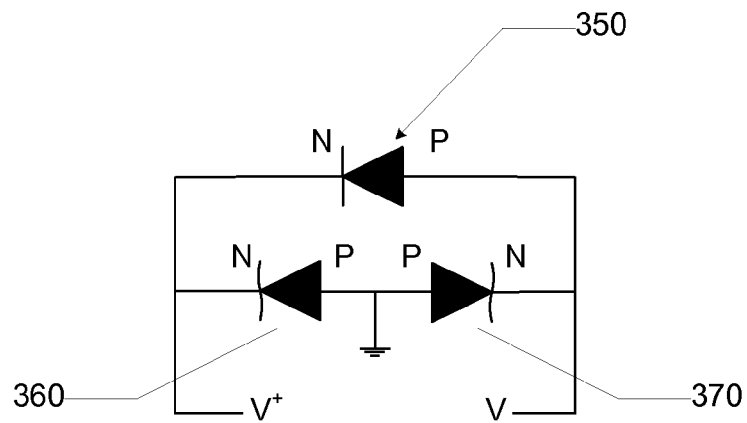
FIG. 3B illustrates the equivalent circuit of an example of an electrostatic discharge circuitry having diodes coupled to an LED, according to one embodiment.

FIG. 3B illustrates the equivalent circuit of an example of an electrostatic discharge circuitry having diodes 360/370 coupled to an LED 350, according to one embodiment.

In one embodiment, an electrostatic discharge circuitry is optionally coupled to the LED 350 that is coupled to two-phase cooling apparatus. In one embodiment the electrostatic discharge circuitry comprises at least one diode 360 connected to the LED 350 in parallel. The diode 360 typically has a breakdown voltage that is lower than that of the LED 350 for ESD protection. Thus, the diode 360 is generally made from materials with lower bandgaps than the materials of the LED 350. In one embodiment, the electrostatic circuitry composes two back to back diodes 360 and 370 connected in series to each other and further in parallel to the LED 350.

The electrostatic discharge circuitry can be useful for LEDs based on materials having wide bandgaps since wide bandgap diodes such as $Al_uIn_vGa_{1-u-v}N$ (u,v≧0:0≦u+v≦1) can be prone to electrostatic failure due to low reverse saturation currents and high breakdown voltages.

When a forward bias is applied to a diode or LED (e.g., LED 350), substantial forward current does not flow until the applied exceeds a threshold voltage (e.g., turn on voltage ~2V). Above this voltage, the current through the LED 350 increases dramatically (e.g., exponentially) with the increase in voltage due to a low internal series resistance of the LED 350 during forward bias.

Contrastingly, when operating in the reverse bias direction the series resistance is significantly higher than when in the forward bias direction and reverse current is relatively low. However, if the reverse bias exceeds the breakdown voltage, the reverse current will increase dramatically. Since the breakdown voltage of the LED diode 350 is generally greater than that of the diode 360 (e.g., silicon zener diode), the current will flow through 360 as opposed to LED 350 thus protecting the LED 350 from electrostatic discharge.

Figure 3C:
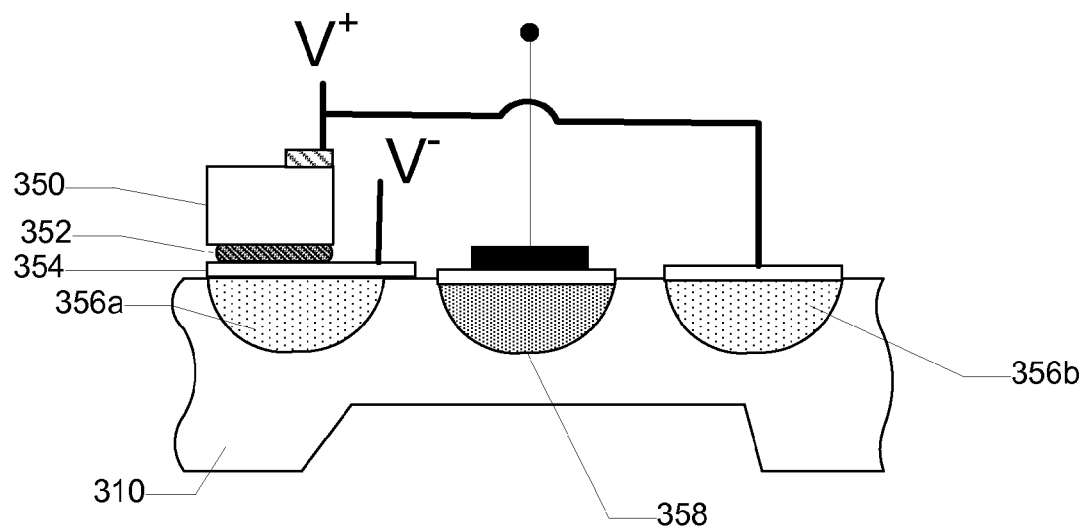
FIG. 3C illustrates a cross section of an example of the evaporator coupled to the LED showing the topology of a back to back zener diode for electrostatic discharge protection, according to one embodiment.

FIG. 3C illustrates a cross section of an example of the evaporator coupled to the LED 350 showing the topology of a back to back zener diode for electrostatic discharge protection, according to one embodiment.

In one embodiment, the LED or LED die 350 is bonded to a bond pad on the top cap 310. The bond 352 may be a solder alloy such as but is not limited to a gold-tin bond. In addition, a metallic layer 354 (e.g., typically thin film) can be deposited for adhesion and wetting of the bond 352 (e.g., gold-tin). The metallic layer 354 typically comprises of adhesion metal including but not limited to, Ti, TiW, and/or Cr. The metallic layer 352 may further include a barrier metal including but not limited to Ni, Pt and a wetting layer (e.g., gold). Underlying this metallization is a n-doped silicon layer 356a layer.

In one embodiment, additional regions/wells are formed in the top cap 310. For example, the regions 356a/b can be doped n-type and the region 358 can be doped p-type. The electrical connections to the p-type region 358 and n-type region 356a/b of the diode can be wire bonded together, for example, by ribbon stitching. In general, the zener diodes can be formed from any suitable material system (e.g., silicon, germanium, GaN, GaAs, etc.) by thin film fabrication. In one embodiment, the active region of the LED 350 comprises material with wide band gaps, including but not limited to, GaN, GaInN, InP, AlGaN, $Al_uIn_vGa_{1-u-v}N$ (u,v≧0:0≦u+v≦1).

Figure 3D:
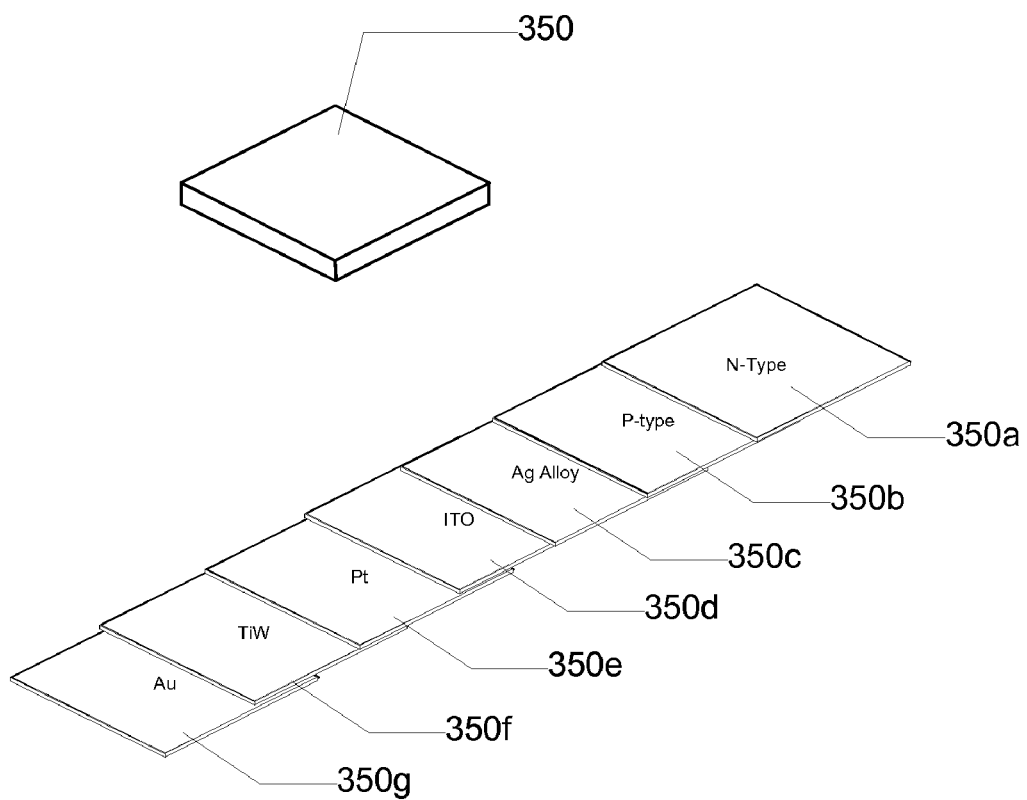
FIG. 3D illustrates an example of an LED where the initial growth substrate has been removed to promote improved thermal design, according to one embodiment.

FIG. 3D illustrates an example of an LED 350 where the initial growth substrate has been removed to promote improved thermal design, according to one embodiment.

In one embodiment, the LED 350 is formed by thin film epitaxial growth. Thin film LEDs are advantageous in that they improve radiation decoupling and heat removal/dissipation. The active layer can be grown epitaxially on a substrate such as silicon carbide or sapphire. The substrate can be removed after growth grinding the silicon carbide or sapphire substrate away. Thus, thin film LEDs that are ~30-50 micrometers thick can be fabricated thus further improving the dissipation and removal of generated heat.

In one embodiment, the active region of the LED or LED die 350 can have one quantum well or a plurality of quantum wells that have multiple doped or un-doped layer(s). In the example LED 350 of FIG. 3D, the first layer 350a of nitrides based n-doped layers electrically coupled to layer 350b of nitrides-based p-doped layer forms the active region of the LED 350.

The LED 350 may further include layer 350c having a reflective surface. For example, the layer 350c may include a layer of metal film (e.g., Ag). Under the reflection layer 350c, a metal conductor 350d that is transparent (e.g., indium tin oxide or zinc oxide) can be used to enhance current spreading with low radiation absorption. The LED 350 may further include a diffusion barrier layer 350e such as a metallic layer (e.g., Pt or Ni). Underlying layer 350e an adhesion layer 350f (e.g., TiW or Cr) can be used to promote adhesion of the final wetting layer 350g (e.g., gold).

Figure 4:
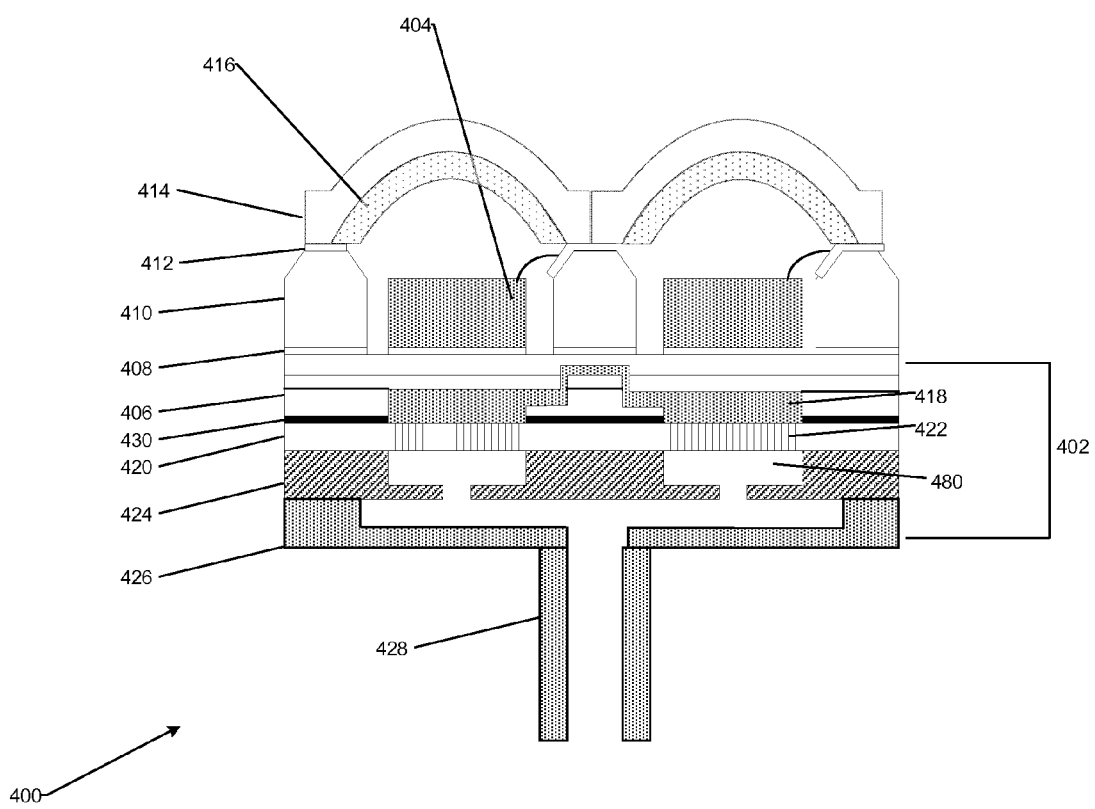
FIG. 4 illustrates a cross sectional view of a discrete LED package integrated with a two-phase cooling apparatus, according to one embodiment.

FIG. 4 illustrates a cross sectional view of a discrete LED package 400 integrated with a two-phase cooling apparatus 402, according to one embodiment.

One embodiment of a system having a discrete LED package 400 includes, a die 404 mounted on a substrate 406, the die 404 having formed thereon a light-emitting device (e.g., light emitting diode, laser, organic light emitting diode, etc.). The substrate 406 may be physically configured to thermally couple heat generated from the light-emitting device to a chamber 418 suitable for liquid storage. The chamber 418 may be formed within the substrate 406 or coupled to the substrate 406. In one embodiment, the system further includes, a layer 420 having through-holes formed from porous structures 422 where the layer 420 has a first side and a second side. The porous structures 422 can be coherent silicon pores of a high length to diameter ratio.

One side of the layer 420 can be in contact with the chamber 418 suitable for liquid storage. In addition, the system includes a vapor collection layer 424 disposed over the second side of the layer 420 having through-holes such that the through-holes are substantially unobstructed to substance flow or movement. The vapor collection layer 424 may be further coupled to a manifold layer 426 having formed therein or is coupled to a vapor port 428 though which vapor exits.

In one embodiment, the discrete LED package 400 further includes an insulating substrate 410 that surrounds the die 404, a lens 414 attached to the insulating substrate 410 that encapsulates the die 404, and/or phosphor material 416 disposed within a region between the die 404 and the lens 414.

The LED package assembly 400 is, in one embodiment, discretely packaged with one or more LED dies 404. In one embodiment, by way of the two-phase cooling apparatus 402 the dies can be packaged in close proximity to one another. The LED dies 404 can include LEDs based on any materials system including but not limited wide bandgap diodes including but not limited to GaAs, GaN, GaInN, and/or AlGaN (e.g., $Al_uIn_vGa_{1-u-v}N$ (u,v≧0:0≦u+v≦1)). The LED die 404 may be mounted to a substrate 406 (e.g., copper, Cu—), for example, via solder 408 (e.g., fluxless solder such as gold tin).

The LED dies 404 can be bound by a glass substrate 410 (e.g., pyrex glass) for insulation between the upper 412 electrodes and the mounting substrate 406. In one embodiment, a lens 414 encapsulates the LED 404. The lens 414 can be fabricated from polymers including but not limited to PMMA. The polymer lens may be used for dispersing the generated light from the LED dies 404 and is typically selected based on the refractive index. In one embodiment, the lens 414 is grated.

Phosphor material 416 can be molded into the interior surface of the lens 414 between the LED 404 and the lens 414. The phosphor material typically includes a garnet material such as Yttrium aluminum garnet (YAG). Dopants that are optically active (e.g., a rare earth element such as Cerium (Ce)) can be used to convert blue, UV or other light emitted from the LED dies 404 to white light or substantially white light. The phosphor material 416 YAG:CE can also be deposited on the inner surface of the lens 414 in a silicone complex or other material. In general, the material silicone/phosphor complex is resistant to UV light due to long potentially prolonged exposure to UV light during operation.

The lower part of the package 400 represents the hybrid integration of the evaporator 402 into the LED packaging 400. Heat generated by the LED dies 404 initially conducts through the solder layer 408 (e.g., the gold tin solder layer). The heat can subsequently be conducted through another conductive layer 406 (e.g., copper and/or aluminum) and coupled to the liquid (e.g., water or other liquids) in a liquid reservoir 418 (e.g., or liquid chamber, chamber, etc.).

The heat generated from the LED dies 404 can be absorbed by the liquid in reservoir 418. The heat generated from the LED can heat the liquid to a state of a temperature and pressure approaching or matching that of the vapor line on the phase diagram for the liquid. Despite the liquid having being in a state close to the vaporization state (e.g., a fully saturated condition) the phase change is predominantly subdued until the liquid is moves through the layer 420 with the porous structures 422. Once the liquid moves through the pores 422 in the layer 420, a vapor chamber 480 provides a open volume to allow the liquid to pass through in phase transition to vapor.

The approach in which the heat passes through the liquid to reach the evaporating interface is also referred to as the "wet wall approach". The liquid reservoir 418 can be bound on one side by the electrically and thermally conductive layer 406 and on the opposing side by porous structures 420 which, in one embodiment, act as a membrane separating the liquid from vapor. The vapor is typically created due to absorption of the heat generated by the LEDs 404 and transported away from the die in the form of latent heat of vaporization. The vapor can be, in one embodiment, collected in the open space of layer 424 and subsequently combined in manifold layer 426 and exits the evaporator 402 through vapor port 428.

The LED package 404 is, in one embodiment, fabricated in the following manner. The LED dies 404 typically come from a separately fabricated wafer in the form of singulated die. A series of photolithographically patterned direct bonded copper (e.g., "DBC") sheets can be brazed together to form the conductive layer 406 (e.g., copper). The copper is typically also made available by companies such as Curamik. A glass wafer can be patterned lithographically with electrodes (e.g., gold), machined with cavities by ultrasonic impact grinding and then bonded to the conductive layer 406 via the solder 408 (e.g., gold-tin).

The LED dies 404 typically come in the form of a reel and can be picked and placed on the conductive layer 406 and soldered, for example, with gold tin solder. The porous structures 420 (e.g., porous silicon, porous germanium, Gallium Arsenide) can be fabricated from semiconductor wafers (e.g., silicon wafers) through a series of micro-patterning and electrochemical etching processes.

These processes are described in detail with further references to co-pending U.S. patent application Ser. No. 11/933,000 entitled "Method for Fabricating Semiconductor-Based Porous Structure", filed "Oct. 31, 2007", Ser. No. 11/932,969 entitled "Integrated Thermal Systems" filed Oct. 31, 2007, Ser. No. 11/932,951 entitled "Semiconductor-Based Porous Structure" filed Oct. 31, 2007, Ser. No. 11/932,911 entitled "System and Method of a Heat Transfer System and a Condensor" filed Oct. 31, 2007, and Ser. No. 11/530,107 entitled "System and Method of a Porous Semiconductor-Based Evaporator (as amended)" filed Sep. 8, 2006, which are incorporated herein by reference.

The layer 420 with the porous structures 422 can then be attached to the conductive layer 406. The connection may be implemented via bonding (e.g., glass frit). The vapor chamber 424, and manifold layer 426 can be fabricated from metals such as Kovar or Invar alloy that are brazed together. In one embodiment, the vapor port 428 can include materials that are robust against corrosion, readily bent to route vapor to its condensation location, and can include by way of example but not limitation, stainless steel, copper and/or nickel. The connection of the vapor port 428 may be formed by brazing.

In general, the light-emitting device can be a light emitting diode, a laser, or any other light emitting units.

Figure 5A:
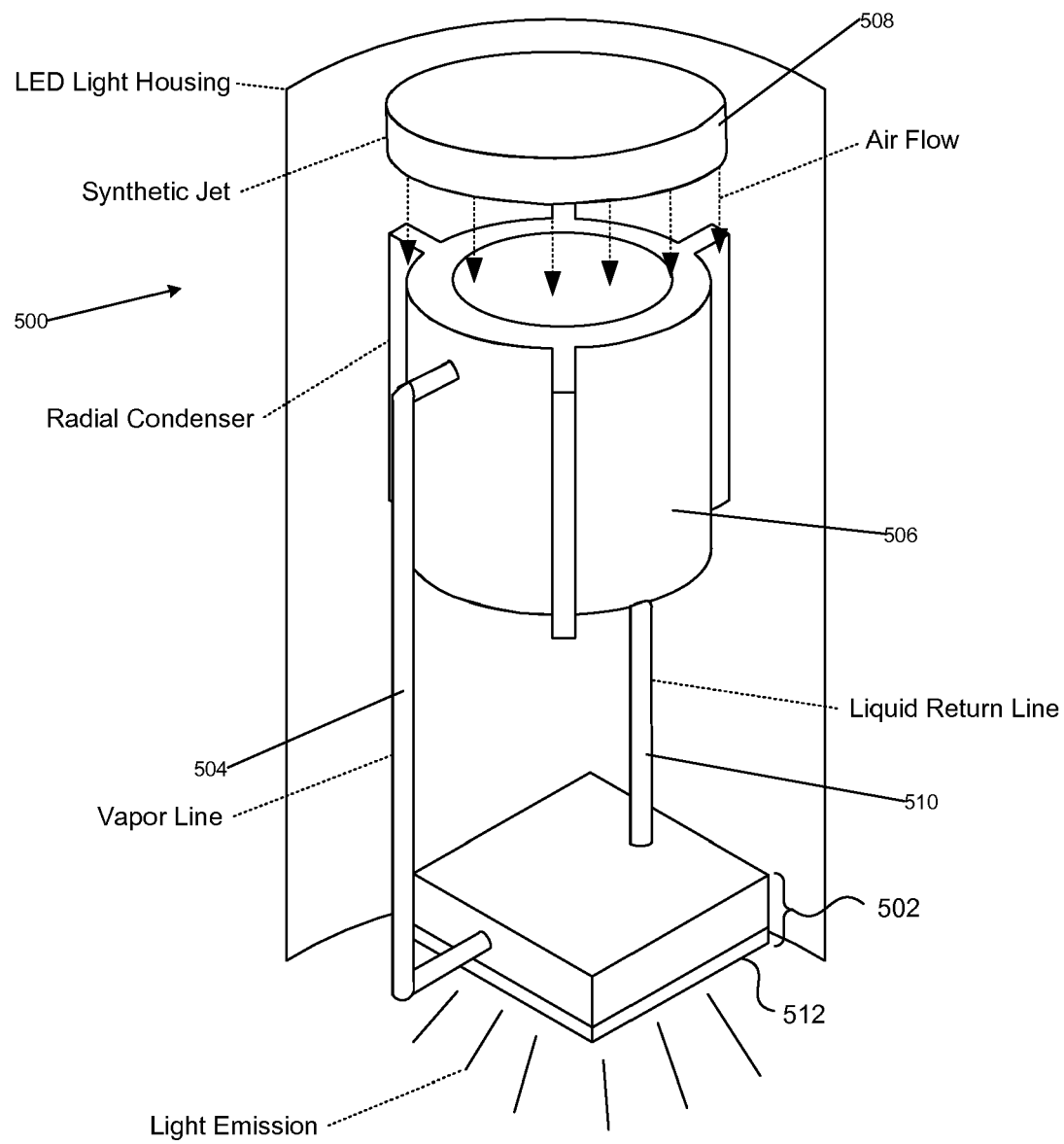
FIG. 5A illustrates an example of a canister type LED lighting apparatus comprising a two-phase cooling apparatus, according to one embodiment.

FIG. 5A illustrates an example of a canister type LED lighting apparatus 500 comprising a two-phase cooling apparatus, according to one embodiment.

The canister type LED lighting apparatus 500 can include an LED or an array of LEDs 512 coupled to the two-phase cooling apparatus. The two-phase cooling apparatus can include an evaporator 502, a vapor line 504, a heat sink 506, and/or a liquid line 510. The vapor line 504 can transport vapor to a condenser embedded in the heat sink 506.

In one embodiment, the LED or array of LEDs 512 are integrated with the evaporator 502 of the two-phase cooling apparatus. The LED or array of LEDs 512 can be integrated with the evaporator 502. The efficiency of condensation of the vapor can be enhanced by the heat sink 506. One embodiment includes an optional air flow generator 508 (e.g., fan) coupled to the heat sink 506. The air flow generator 508 can be a low velocity fan or in one embodiment a synthetic jet module but in the majority of cases it is anticipated the heat will be removed by natural convection. After the vapor has experienced phase change to fluid, the fluid is delivered back to the evaporator package via a liquid line 510.

Figure 5B:
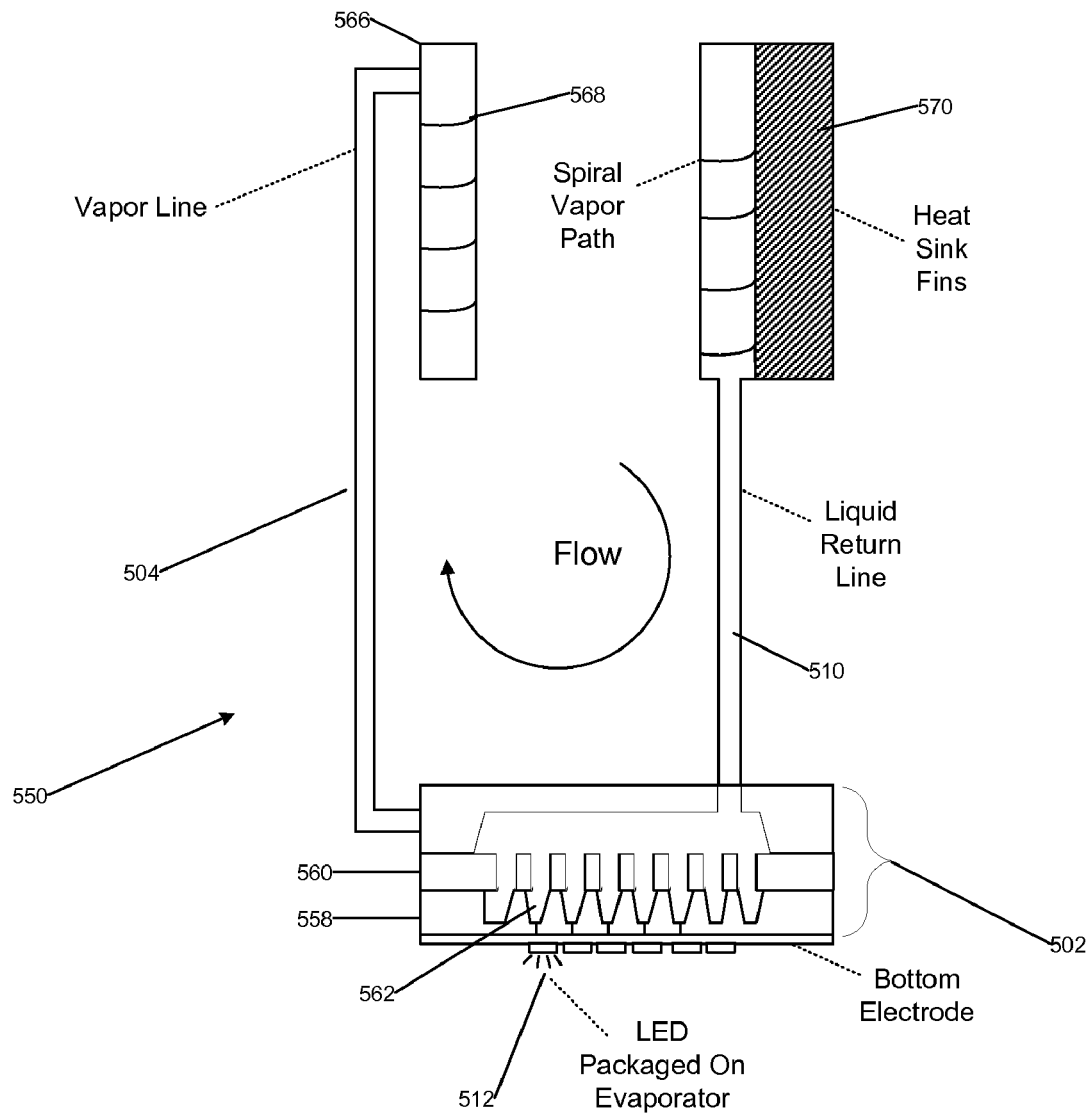
FIG. 5B illustrates the cross sectional view of the canister type LED lighting apparatus 500 utilizing a two-phase cooling apparatus, according to one embodiment.

FIG. 5B illustrates the cross sectional view of the canister type LED lighting apparatus 500 utilizing a two-phase cooling apparatus, according to one embodiment.

In the cross sectional view, the LED dies 512 can be seen to be directly packaged on/integrated with the evaporator 502. In the micro loop heat pipe approach, the heat generated by the LED die 512 conducts through a top cap layer 558 to a layer 560 having porous structures. The vapor is mostly generated from absorption of heat emitted from the LED dies 512 by the liquid supplied by the chamber 570. The generated vapor can then exit the evaporator 502 through the spaces 562 formed in the top cap 558. The vapor moves along the top cap 558 layer and can manifold to the vapor line 504 where the vapor can be transported to the condenser 566.

Within the condenser 566, the vapor acts to spread heat along the heat sink surface to make it nearly isothermal as it condensed on the interior surface. In one embodiment, a series of spiraling fins 568 within the condenser 566 act to increase the vapor path length ensuring condensation and utilizes gravity to cause the condensed liquid to flow down toward the evaporator. The heat from the interior of the condenser 566 can subsequently transfer to the fins 568 of the heat sink where it can be dissipated to the ambient air.

Figure 6:
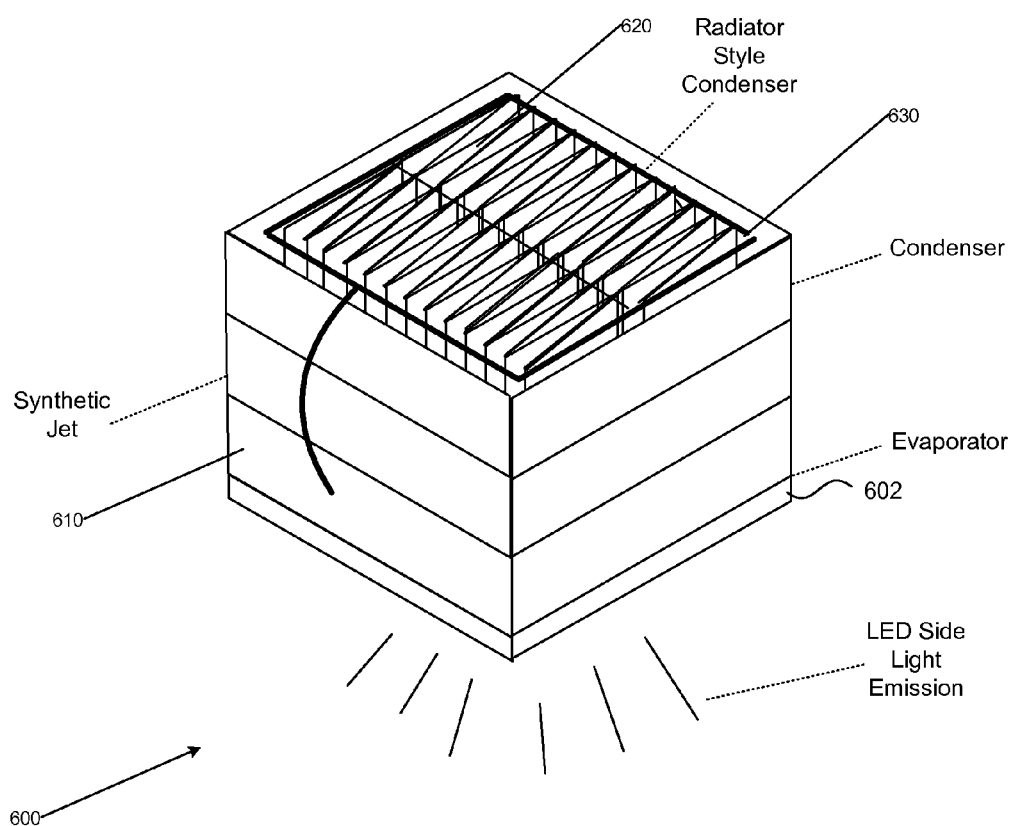
FIG. 6 illustrates an example of an LED package integrated with a two-phase cooling apparatus using an alternative air flow generator, according to one embodiment

FIG. 6 illustrates an example of an LED package 600 integrated with a two-phase cooling apparatus using an alternative air flow generator 630, according to one embodiment.

In this design the LED or LED die 602 module is co-packaged with the evaporator 610 where the heat is transported to a heat sink 620 (e.g., a radiator style) with thin corrugated fins. In this cubic luminary design, a corona discharge device 630 can be integrated with the two-phase cooling apparatus to facilitate air flow to stimulate convection heat flow from the radiator fins of the heat sink 620.

Compact LED luminaries with bright white light and of a small form factor can be useful as accent lights for display purposes. Also the small form factor and cubic repeat unit design the lights can be daisy chained for display or track lighting.

Figure 7:
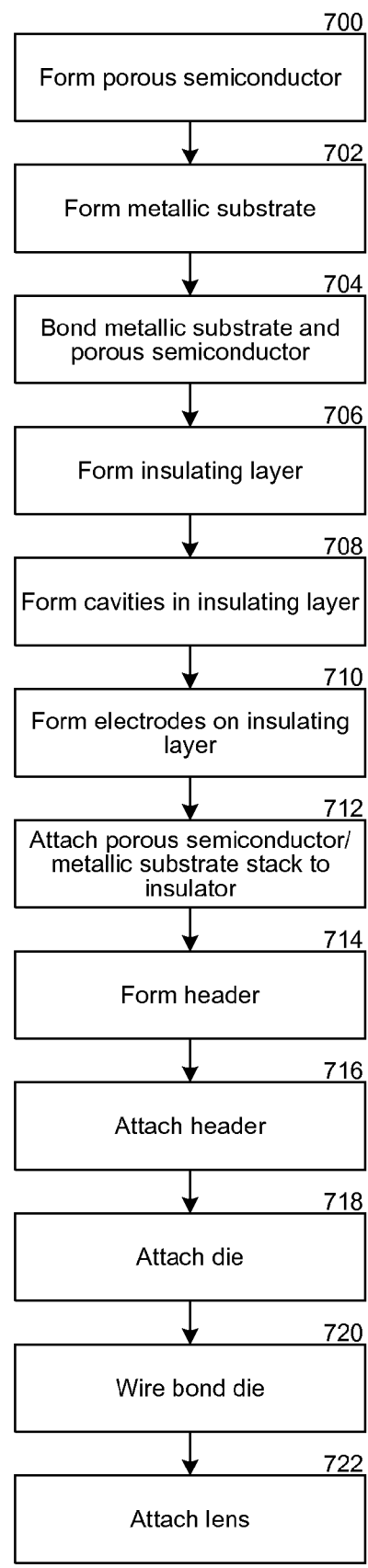
FIG. 7 illustrates an example process flow for forming an LED packaged with a two-phase cooling apparatus, according to one embodiment.

FIG. 7 illustrates an example process flow for forming an LED packaged with a two-phase cooling apparatus, according to one embodiment.

In process 702, porous structures are formed in a semiconductor layer. The porous structure may be formed via one or more convenient and/or known methods. In one embodiment, the porous structures are, for example, formed via methods as described in co-pending U.S. patent application entitled "Method of Fabricating Semiconductor-based Porous Structure", application Ser. No. 11/933,000 filed Oct. 31, 2007, the contents of which are incorporated by reference herein.

In process 704 a metallic substrate is formed. The metallic substrate is formed by patterning metal foil and brazing them together. Alternatively, the metal foils can be attached by particle injection molding or additive stereo lithography.

In process 706, the metallic substrate and the porous semiconductor are coupled. The coupling may be achieved via bonding (e.g., bonding using solder alloy).

In process 708, an insulating layer is formed. The insulating layer can be formed by spinning on glass or sputtering directly on top of the metallic substrate via patterning and etching. Alternatively, the insulator layer can be formed of thin glass sheet. In process 710, cavities are formed by etching or grinding (e.g., ultrasonic impact grinding) cavities in the insulating layer (e.g., glass).

In process 712, electrodes are formed on the insulating layer. The electrodes (e.g., glass electrodes) can be formed by any known or convenient method including but not limited to, evaporation, sputtering or electroplating. If the insulating layer is not joined to the porous semiconductor/metallic substrate stack then it can be performed in process 714. A liquid distribution network or header can be formed in process 716. The liquid distribution network can be formed by brazing metallic layers (e.g., the metallic layers 424, 426, 428 of FIG. 4).

In process 718, the liquid distribution network (e.g., header) can be attached to the earlier mentioned layers. In process 720, a light emitting die is attached to the metallic substrate. The die is wire bonded for electrical connection in process 722. Then in process 724, the die is encapsulated by a lens attachment. The lens can be coated with phosphor on its concave side. A vapor chamber may subsequently be formed from metallic material. Furthermore, a vapor port may be formed and brazed to the vapor chamber to form a connection.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or subcombinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

Any patents and applications and other references noted above, including any that may be listed in accompanying filing papers, are incorporated herein by reference. Aspects of the disclosure can be modified, if necessary, to employ the systems, functions, and concepts of the various references described above to provide yet further embodiments of the disclosure.

These and other changes can be made to the disclosure in light of the above Detailed Description. While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

While certain aspects of the disclosure are presented below in certain claim forms, the inventors contemplate the various aspects of the disclosure in any number of claim forms. For example, while only one aspect of the disclosure is recited as a means-plus-function claim under 35 U.S.C. §112, ¶6, other aspects may likewise be embodied as a means-plus-function claim, or in other forms, such as being embodied in a computer-readable medium. (Any claims intended to be treated under 35 U.S.C. §112, ¶6 will begin with the words "means for".) Accordingly, the applicant reserves the right to add additional claims after filing the application to pursue such additional claim forms for other aspects of the disclosure.

What is claimed is:

1. An apparatus, comprising:
    a light-emitting device; and
    a two-phase cooling apparatus coupled to the light-emitting device, wherein the two-phase cooling apparatus includes:
        a first layer which mounts the light-emitting device and channels vapor along a heat transfer region;
        a liquid-permeable porous structure, coupled to the first layer, which transports vapor to a vapor line, wherein the vapor is generated at a liquid meniscus of the liquid-permeable porous structure at a phase change temperature;
        a second layer, hydraulically coupled to the liquid-permeable porous structure, which contains liquid below a phase change temperature; and
        a spiral condenser, coupled to the second layer, by which vapor condenses to liquid and returns to the second layer; and
        a heat sink coupled to the spiral condenser, wherein vapor entering the spiral condenser spreads heat along a surface of the heat sink such that an interior temperature of the spiral condenser is substantially isothermal to a saturation temperature promoting transfer of heat to ambient air.

2. The apparatus of claim 1,
    wherein the liquid-permeable porous structure forms through-holes across the porous structure; wherein, the through-holes include first and second ends;
    and the apparatus further comprises a chamber that stores liquid coupled to the liquid-permeable porous structure;
    wherein, the first ends of the through-holes are proximal to the chamber;
    such that, when in operation, the porous structure is liquid permeable allowing the liquid in the chamber to travel through the through-holes towards the second ends and evaporation from a liquid meniscus at a phase change temperature creates vapor;
    and the spiral condenser has a series of spiraling fins to condense the liquid.

3. The apparatus of claim 2, wherein, the light emitting device is formed on a wafer or a die; wherein, the porous structures include porous semiconductor structures.

4. The apparatus of claim 2, wherein, in operation, the heat absorbed from the light-emitting device is at least a latent heat of the substance.

5. The apparatus of claim 4, further comprising, a corona discharge device coupled to the condenser to stimulate convection.

6. The apparatus of claim 2, wherein, the two phase cooling apparatus further comprises:
a liquid port that couples the chamber to the condenser.

7. The apparatus of claim 2, further comprising:
a heat sink coupled to the condenser.

8. The apparatus of claim 6, wherein, the series of spiraling fins utilizes gravity to cause the condensed liquid to flow down toward a coupled evaporator.

9. The apparatus of claim 2, wherein, the two-phase cooling apparatus further comprises:
a vapor collection layer;
wherein, the second ends of the through-holes are proximal to the vapor collection layer.

10. The apparatus of claim 9, wherein, the chamber is coupled to the light emitting device.

11. The apparatus of claim 9, wherein, when in operation, the heat generated from the light-emitting device causes the liquid stored in the chamber to travel through the through-holes and convert into vapor.

12. The apparatus of claim 9, wherein, the vapor collection layer is coupled to the liquid-permeable porous structure such that the first ends of the through-holes are substantially unobstructed to liquid or vapor flow.

13. The apparatus of claim 9, wherein, the vapor collection layer has formed within or is coupled to the vapor port.

14. The apparatus of claim 9, wherein, the vapor collection layer and the chamber are formed from material that is thermally conductive.

15. The apparatus of claim 9, wherein the vapor collection layer comprises substantially of, one or more of, Kovar, Invar, copper tungsten alloy, silicon, germanium, diamond, SiC, and/or CMOS-grade silicon.

16. The apparatus of claim 14, wherein the chamber is formed from one or more of, aluminum and copper.

17. The apparatus of claim 9, wherein the vapor collection layer comprises substantially of, copper.

18. The apparatus of claim 9, wherein the vapor collection layer comprises substantially of, aluminum nitride.

19. The apparatus of claim 9, wherein the chamber is formed from stainless steel.

20. The apparatus of claim 1,
wherein, the two-phase cooling apparatus comprises a loop heat pipe,
wherein the liquid-permeable porous structure is within the loop heat pipe, and the liquid-permeable porous structure has through-holes across the porous structure;
wherein, the through-holes have a high length to diameter aspect ratio.

21. The apparatus of claim 20, wherein the loop heat pipe further comprises, a chamber suitable for storage of liquid coupled to the liquid-permeable porous structure.

22. The apparatus of claim 20, wherein the loop heat pipe further comprises, a top cap portion thermally coupled to the liquid-permeable porous structure.

23. The apparatus of claim 22,
wherein the through-holes having first and second ends,
wherein, the first ends of the through-holes are proximal to the top cap portion and the second ends of the through-holes are proximal to the chamber.

24. The apparatus of claim 23, wherein, the top cap portion is coupled to the liquid-permeable porous structure such that the first ends of the through-holes are substantially unobstructed to liquid or vapor flow.

25. The apparatus of claim 22, wherein, when in operation, the heat generated from the light-emitting device causes the liquid stored in the chamber to travel through the through-holes and convert into vapor.

26. The apparatus of claim 22, wherein, the top cap portion has formed within or is coupled to a vapor port.

27. The apparatus of claim 20, wherein, the through-holes have a length to diameter aspect ratio of approximately 60 to 205.

28. The apparatus of claim 1, wherein, the light-emitting device comprises wide band gap material based light emitting diode.

29. The apparatus of claim 1, wherein, the light-emitting device comprises a thin film light emitting diode.

30. The apparatus of claim 1, wherein, the two-phase cooling apparatus further comprises a vapor port coupled to the spiral condenser, wherein the vapor port is substantially unobstructed to allow the generated vapor to exit.

31. The apparatus of claim 1, wherein the two-phase cooling apparatus further comprises a chamber thermally coupled to the light-emitting device, wherein heat generated from the light-emitting device is absorbed by a liquid stored in the chamber.

32. The apparatus of claim 1, further comprising a heat sink coupled to the spiral condenser.

* * * * *